United States Patent
Dolk et al.

(10) Patent No.: US 12,339,592 B2
(45) Date of Patent: Jun. 24, 2025

(54) METHOD FOR THERMO-MECHANICAL CONTROL OF A HEAT SENSITIVE ELEMENT AND DEVICE FOR USE IN A LITHOGRAPHIC PRODUCTION PROCESS

(71) Applicant: ASML Netherlands B.V., Veldhoven (NL)

(72) Inventors: Victor Sebastiaan Dolk, Eindhoven (NL); Koos Van Berkel, Waalre (NL); Mauritius Gerardus Elisabeth Schneiders, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 18/010,637

(22) PCT Filed: Jun. 2, 2021

(86) PCT No.: PCT/EP2021/064753
§ 371 (c)(1),
(2) Date: Dec. 15, 2022

(87) PCT Pub. No.: WO2022/002519
PCT Pub. Date: Jan. 6, 2022

(65) Prior Publication Data
US 2023/0229090 A1    Jul. 20, 2023

(30) Foreign Application Priority Data
Jul. 1, 2020 (EP) .................... 20183453

(51) Int. Cl.
*G03F 7/00* (2006.01)
(52) U.S. Cl.
CPC ...... *G03F 7/70891* (2013.01); *G03F 7/70504* (2023.05); *G03F 7/70525* (2013.01); *G03F 7/706* (2013.01)

(58) Field of Classification Search
CPC ...... G03F 7/705; G03F 7/70504; G03F 7/706; G03F 7/7085; G03F 7/70891;
(Continued)

(56) References Cited

U.S. PATENT DOCUMENTS 4,422,725 A    12/1983  Prewo
5,390,228 A *   2/1995  Niibe .................. G03F 7/70008
                                                                 359/846
(Continued)

FOREIGN PATENT DOCUMENTS

CN      103246175 A    8/2013
CN      110476125 A    11/2019
(Continued)

OTHER PUBLICATIONS

European International Searching Authority, International Search Report and Written Opinion, counterpart PCT Application No. PCT/EP2021/064753, mailed Sep. 23, 2021, 12 pages.
(Continued)

*Primary Examiner* — Deoram Persaud
(74) *Attorney, Agent, or Firm* — DiBerardino McGovern IP Group LLC

(57) ABSTRACT

The invention provides a method for thermo-mechanical control of a heat sensitive element (MI) subject to a heat load, comprising: —providing a non-linear thermo-mechanical model of the heat sensitive element describing a dynamical relationship between characteristics of the heat load and deformation of the heat sensitive element; —calculating a control signal on the basis of an optimization calculation of the non-linear model, —providing an actuation signal to a heater (HE), wherein the actuation signal is at least partially based on the control signal, —heating the heat sensitive element by the heater on the basis of the actuation signal.

25 Claims, 3 Drawing Sheets

(58) Field of Classification Search
CPC .............. G03F 7/70266; G03F 7/70525; G03F 7/70625; G03F 7/70633; G03F 7/70641; G02B 7/028
See application file for complete search history.

(56) References Cited

U.S. PATENT DOCUMENTS

| | | | | |
|---|---|---|---|---|
| 5,581,324 | A * | 12/1996 | Miyai | G03F 7/70258 355/53 |
| 5,883,704 | A | 3/1999 | Nishi et al. | |
| 6,952,253 | B2 | 10/2005 | Lof et al. | |
| 9,164,402 | B2 * | 10/2015 | Walter | G02B 7/028 |
| 9,383,660 | B2 * | 7/2016 | Yoshihara | G03F 7/705 |
| 2004/0165161 | A1 * | 8/2004 | Hara | G03B 27/52 355/53 |
| 2007/0211233 | A1 * | 9/2007 | Van De Kerkhof | G03F 7/70575 355/53 |
| 2009/0257032 | A1 * | 10/2009 | Eva | G02B 7/028 355/30 |
| 2009/0296055 | A1 | 12/2009 | Ye et al. | |
| 2011/0205516 | A1 * | 8/2011 | De Vries | G03F 7/70883 355/77 |
| 2012/0133914 | A1 * | 5/2012 | Prosyentsov | G03F 7/70783 355/53 |
| 2013/0212543 | A1 | 8/2013 | Crouse et al. | |
| 2014/0047397 | A1 | 2/2014 | Ye et al. | |
| 2014/0272717 | A1 * | 9/2014 | Cheng | G03F 7/00 716/55 |
| 2017/0153552 | A1 * | 6/2017 | Prochnau | G02B 5/0891 |
| 2020/0073252 | A1 | 3/2020 | Juergens et al. | |
| 2023/0273527 | A1 * | 8/2023 | Schneiders | G03F 7/70891 355/30 |
| 2024/0077380 | A1 * | 3/2024 | Van De Wal | G03F 7/706 |
| 2024/0160108 | A1 * | 5/2024 | Sotiropoulos | G03F 7/7085 |

FOREIGN PATENT DOCUMENTS

| | | |
|---|---|---|
| DE | 102018215727 A1 | 6/2019 |
| JP | H0950952 A | 2/1997 |
| KR | 1019970012978 A | 3/1997 |
| TW | 201642048 A | 12/2016 |
| WO | 2012097833 A1 | 7/2012 |
| WO | 2020182386 A1 | 9/2020 |

OTHER PUBLICATIONS

Moritz Diehl et al., "A Real-Time Iteration Scheme for Nonlinear Optimization in Optimal Feedback Control," SIAM J. Control Optim. vol. 43, No. 5, pp. 1714-1736 (2005).

Gabriela Diaz Cortes, "POD-based Deflation Method for Reservoir Simulation," Delft University of Technology, available at https://doi.org/10.4233/uuid:0458fd29-920b-43cb-8c2b-e04be8db0dc7 (2019).

Yanjie Mao et al., "Modeling and optimization of lens heating effect for lithographic projector," J. Micro/Nanolith., MEMS MOEMS 17(2):023501 (Apr.-Jun. 2018).

* cited by examiner

Fig. 3
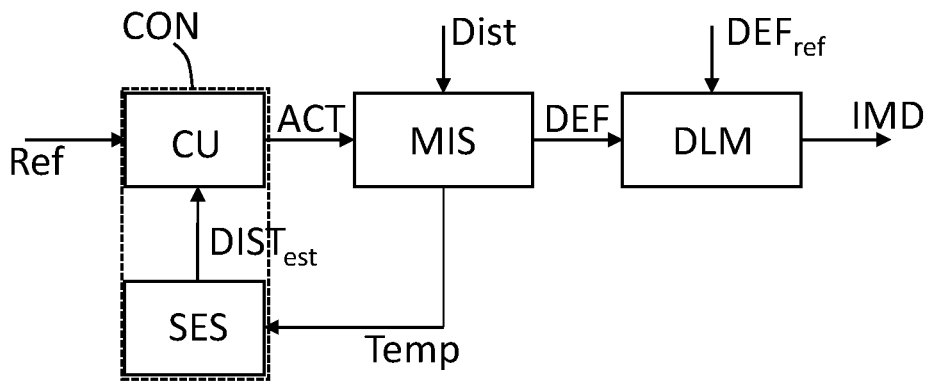
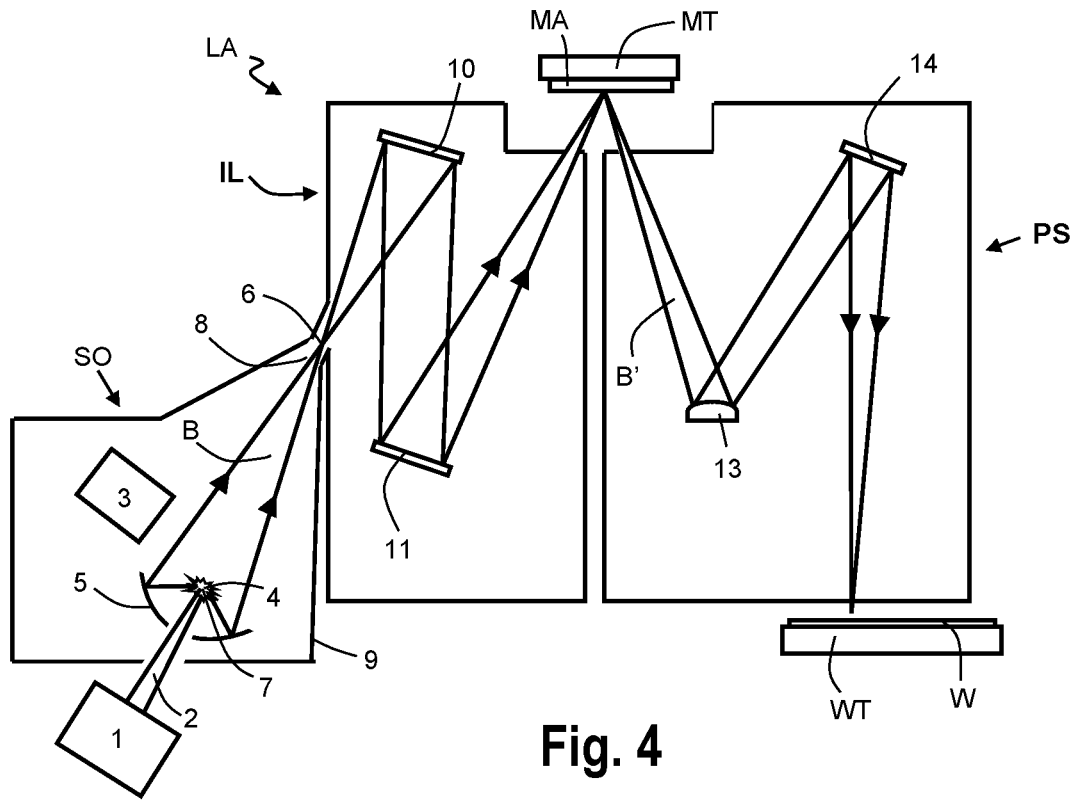
Fig. 4

METHOD FOR THERMO-MECHANICAL CONTROL OF A HEAT SENSITIVE ELEMENT AND DEVICE FOR USE IN A LITHOGRAPHIC PRODUCTION PROCESS

CROSS-REFERENCE TO RELATED APPLICATIONS

This application claims priority of EP application 20183453.8 which was filed on 1 Jul. 2020, and which is incorporated herein in its entirety by reference.

FIELD

The present invention relates to a method for thermo-mechanical control of a heat sensitive element and a device for use in a lithographic production process.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern (also often referred to as "design layout" or "design") of a patterning device (e.g., a mask) onto a layer of radiation-sensitive material (resist) provided on a substrate (e.g., a wafer).

As semiconductor manufacturing processes continue to advance, the dimensions of circuit elements have continually been reduced while the amount of functional elements, such as transistors, per device has been steadily increasing over decades, following a trend commonly referred to as 'Moore's law'. To keep up with Moore's law the semiconductor industry is chasing technologies that enable to create increasingly smaller features. To project a pattern on a substrate a lithographic apparatus may use electromagnetic radiation. The wavelength of this radiation determines the minimum size of features which are patterned on the substrate. Typical wavelengths currently in use are 365 nm (i-line), 248 nm, 193 nm and 13.5 nm. A lithographic apparatus, which uses extreme ultraviolet (EUV) radiation, having a wavelength within a range of 4 nm to 20 nm, for example 6.7 nm or 13.5 nm, may be used to form smaller features on a substrate than a lithographic apparatus which uses, for example, radiation with a wavelength of 193 nm.

During the exposure of wafers, objects of the lithographic apparatus may be subject to substantial heat load, in particular objects of the lithographic apparatus arranged to transmit or reflect the beam of electromagnetic radiation, may be subject of such heat load. This heat load may have a negative influence on the performance of the respective objects of the respective elements in the lithographic process.

For example, mirrors are used to reflect the beam of radiation in a so-called Projection-Optics-Box (POB). These mirrors are subject to heat induced by DUV, EUV and/or infrared light of a radiation beam originating from a light source leading to undesired deformations of the optical surfaces. The latter phenomenon is also referred to as mirror/lens heating. Mirror heating may have a significant impact on the total overlay, focus and projection performance of the lithographic process. This impact can partially be compensated via mirror and/or stage adjustments. The compensation mechanism is referred to as a driver lens model (DLM). The correction capabilities of DLM itself are however insufficient to achieve the desired performance.

In a known embodiment of a lithographic apparatus the heat load is compensated by a mirror heater arranged to heat the mirror to a predetermined temperature. This predetermined temperature is often selected as a temperature in which the material of the mirror has a relative low thermal sensitivity. The temperature at which the derivative of the strain-temperature curve is equal to zero is referred to as the zero-crossing temperature (ZCT). Often this ZCT is a suitable temperature as a predetermined temperature, whereby the heater is configured to maintain the mirror at the ZCT or close to the ZCT.

Since it takes a long time for the reflective surface of the mirror to reach a steady-state temperature profile after each patterning device change and corresponding change in illumination settings, an active feedback control strategy is used to make sure that the power of the mirror heater is properly adjusted during transient responses. Known control strategies for mirror heating are temperature based where the average temperature of the mirror is regulated towards a fixed set-point. This set-point is obtained from a worst-case steady-state analysis over a limited set of load-cases. Hence, temperature-based control strategies are in general conservative and do not necessarily improve the projection performance in transient situations as the set-point design is based on a worst-case steady-state analysis only.

SUMMARY

It is an object of the invention to provide a method for thermo-mechanical control of a heat sensitive element, for example a mirror of a projection optics box of a lithographic apparatus, that is subject to heat of a radiation beam impinging on the heat sensitive element, which method provides a more accurate control of effects caused by heating of the heat sensitive element by the radiation beam.

It is another object of the invention to provide a device for use in a lithographic production process, such as a lithographic apparatus or a metrology tool, that is capable of improved thermo-mechanical control of a heat sensitive element in the device, such as a mirror, which is heated by a radiation beam used in the device.

According to an aspect of the invention there is provided a method for method for thermo-mechanical control of a heat sensitive element subject to a heat load, comprising:
  providing a non-linear thermo-mechanical model of the heat sensitive element describing a dynamical relationship between characteristics of the heat load and deformation of the heat sensitive element;
  calculating a control signal on the basis of an optimization calculation of the non-linear model,
  providing an actuation signal to a heater, wherein the actuation signal is at least partially based on the control signal,
  heating the heat sensitive element by the heater on the basis of the actuation signal.

According to an aspect of the invention, there is provided a device for use in a lithographic production process, comprising:
  a light source arranged to provide a radiation beam
  a heat sensitive element arranged to be impinged by the radiation beam,
  a heater arranged to heat the heat sensitive element to control a temperature of the heat sensitive element,
  a control device to provide a actuation signal to the heater, wherein the control device comprises a controller arranged to provide a control signal as part of the actuation signal, wherein the controller comprises a non-linear thermo-mechanical model of the heat sensitive element describing a dynamical relationship between a heat load on the heat sensitive element and deformation of the heat sensitive element, and wherein the controller is arranged to calculate the control signal on the basis of an optimization calculation of the non-linear model.

BRIEF DESCRIPTION OF THE DRAWINGS

Embodiments of the invention will now be described, by way of example only, with reference to the accompanying schematic drawings, in which:

FIG. 3 schematically depicts a control scheme of an embodiment of the control strategy of the invention.

FIG. 4 depicts a schematic overview of an EUV lithographic apparatus.

DETAILED DESCRIPTION

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range of about 5-100 nm).

The term "reticle", "mask" or "patterning device" as employed in this text may be broadly interpreted as referring to a generic patterning device that can be used to endow an incoming radiation beam with a patterned cross-section, corresponding to a pattern that is to be created in a target portion of the substrate. The term "light valve" can also be used in this context. Besides the classic mask (transmissive or reflective, binary, phase-shifting, hybrid, etc.), examples of other such patterning devices include a programmable mirror array and a programmable LCD array.

Figure 1:
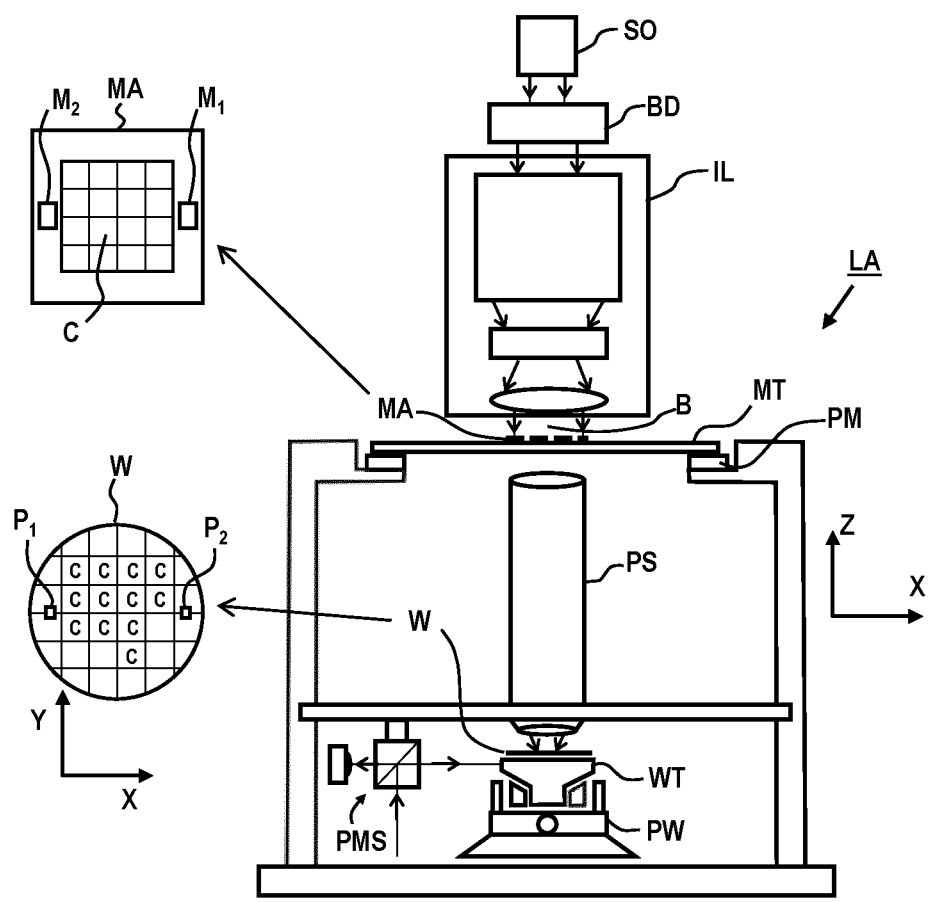
FIG. 1 depicts a schematic overview of a lithographic apparatus.

FIG. 1 schematically depicts a lithographic apparatus LA. The lithographic apparatus LA includes an illumination system (also referred to as illuminator) IL configured to condition a radiation beam B (e.g., UV radiation, DUV radiation or EUV radiation), a mask support (e.g., a mask table) MT constructed to support a patterning device (e.g., a mask) MA and connected to a first positioner PM configured to accurately position the patterning device MA in accordance with certain parameters, a substrate support (e.g., a wafer table) WT constructed to hold a substrate (e.g., a resist coated wafer) W and connected to a second positioner PW configured to accurately position the substrate support in accordance with certain parameters, and a projection system (e.g., a refractive projection lens system) PS configured to project a pattern imparted to the radiation beam B by patterning device MA onto a target portion C (e.g., comprising one or more dies) of the substrate W.

In operation, the illumination system IL receives a radiation beam from a radiation source SO, e.g. via a beam delivery system BD. The illumination system IL may include various types of optical components, such as refractive, reflective, magnetic, electromagnetic, electrostatic, and/or other types of optical components, or any combination thereof, for directing, shaping, and/or controlling radiation. The illuminator IL may be used to condition the radiation beam B to have a desired spatial and angular intensity distribution in its cross section at a plane of the patterning device MA.

The term "projection system" PS used herein should be broadly interpreted as encompassing various types of projection system, including refractive, reflective, catadioptric, anamorphic, magnetic, electromagnetic and/or electrostatic optical systems, or any combination thereof, as appropriate for the exposure radiation being used, and/or for other factors such as the use of an immersion liquid or the use of a vacuum. Any use of the term "projection lens" herein may be considered as synonymous with the more general term "projection system" PS.

The lithographic apparatus LA may be of a type wherein at least a portion of the substrate may be covered by a liquid having a relatively high refractive index, e.g., water, so as to fill a space between the projection system PS and the substrate W-which is also referred to as immersion lithography. More information on immersion techniques is given in U.S. Pat. No. 6,952,253, which is incorporated herein by reference.

The lithographic apparatus LA may also be of a type having two or more substrate supports WT (also named "dual stage"). In such "multiple stage" machine, the substrate supports WT may be used in parallel, and/or steps in preparation of a subsequent exposure of the substrate W may be carried out on the substrate W located on one of the substrate support WT while another substrate W on the other substrate support WT is being used for exposing a pattern on the other substrate W. In addition to the substrate support WT, the lithographic apparatus LA may comprise a measurement stage. The measurement stage is arranged to hold a sensor and/or a cleaning device. The sensor may be arranged to measure a property of the projection system PS or a property of the radiation beam B. The measurement stage may hold multiple sensors. The cleaning device may be arranged to clean part of the lithographic apparatus, for example a part of the projection system PS or a part of a system that provides the immersion liquid. The measurement stage may move beneath the projection system PS when the substrate support WT is away from the projection system PS.

In operation, the radiation beam B is incident on the patterning device, e.g. mask, MA which is held on the mask support MT, and is patterned by the pattern (design layout) present on patterning device MA. Having traversed the patterning device MA, the radiation beam B passes through the projection system PS, which focuses the beam onto a target portion C of the substrate W. With the aid of the second positioner PW and a position measurement system PMS, the substrate support WT can be moved accurately, e.g., so as to position different target portions C in the path of the radiation beam B at a focused and aligned position. Similarly, the first positioner PM and possibly another position sensor (which is not explicitly depicted in FIG. 1) may be used to accurately position the patterning device MA with respect to the path of the radiation beam B. Patterning device MA and substrate W may be aligned using mask alignment marks M1, M2 and substrate alignment marks P1, P2. Although the substrate alignment marks P1, P2 as illustrated occupy dedicated target portions, they may be located in spaces between target portions. Substrate alignment marks P1, P2 are known as scribe-lane alignment marks when these are located between the target portions C.

To clarify the invention, a Cartesian coordinate system is used. The Cartesian coordinate system has three axis, i.e., an x-axis, a y-axis and a z-axis. Each of the three axis is orthogonal to the other two axis. A rotation around the x-axis is referred to as an Rx-rotation. A rotation around the y-axis is referred to as an Ry-rotation. A rotation around about the z-axis is referred to as an Rz-rotation. The x-axis and the y-axis define a horizontal plane, whereas the z-axis is in a vertical direction. The Cartesian coordinate system is not limiting the invention and is used for clarification only. Instead, another coordinate system, such as a cylindrical coordinate system, may be used to clarify the invention. The orientation of the Cartesian coordinate system may be different, for example, such that the z-axis has a component along the horizontal plane.

FIG. 4 shows another example of a lithographic system comprising a radiation source SO and a lithographic apparatus LA. The radiation source SO is configured to generate an EUV radiation beam B and to supply the EUV radiation beam B to the lithographic apparatus LA. The lithographic apparatus LA comprises an illumination system IL, a support structure MT configured to support a patterning device MA (e.g., a mask), a projection system PS and a substrate table WT configured to support a substrate W.

The illumination system IL is configured to condition the EUV radiation beam B before the EUV radiation beam B is incident upon the patterning device MA. Thereto, the illumination system IL may include a facetted field mirror device 10 and a facetted pupil mirror device 11. The faceted field mirror device 10 and faceted pupil mirror device 11 together provide the EUV radiation beam B with a desired cross-sectional shape and a desired intensity distribution. The illumination system IL may include other mirrors or devices in addition to, or instead of, the faceted field mirror device 10 and faceted pupil mirror device 11.

After being thus conditioned, the EUV radiation beam B interacts with the patterning device MA. As a result of this interaction, a patterned EUV radiation beam B' is generated. The projection system PS is configured to project the patterned EUV radiation beam B' onto the substrate W. For that purpose, the projection system PS may comprise a plurality of mirrors 13,14 which are configured to project the patterned EUV radiation beam B' onto the substrate W held by the substrate table WT. The projection system PS may apply a reduction factor to the patterned EUV radiation beam B', thus forming an image with features that are smaller than corresponding features on the patterning device MA. For example, a reduction factor of 4 or 8 may be applied. Although the projection system PS is illustrated as having only two mirror elements 13, 14 in FIG. 4, the projection system PS may include a different number of mirrors (e.g. six or eight mirrors).

The substrate W may include previously formed patterns. Where this is the case, the lithographic apparatus LA aligns the image, formed by the patterned EUV radiation beam B', with a pattern previously formed on the substrate W.

A relative vacuum, i.e. a small amount of gas (e.g. hydrogen) at a pressure well below atmospheric pressure, may be provided in the radiation source SO, in the illumination system IL, and/or in the projection system PS.

The radiation source SO may be a laser produced plasma (LPP) source, a discharge produced plasma (DPP) source, a free electron laser (FEL) or any other radiation source that is capable of generating EUV radiation.

The projection system PS of the lithographic apparatus LA of FIG. 4 comprises a mirror element 14 to reflect a patterned radiation beam to guide the patterned radiation beam along a projection path. This reflection of the patterned radiation beam induces a substantial heat load on the mirror element ME. This heat load may cause thermal stresses within the mirror element ME and deformations as an effect of these thermal stresses. The deformation of the mirror element ME may have a substantial negative effect on the focus and overlay performance of the lithographic apparatus, and should therefore be avoided.

Figure 2:
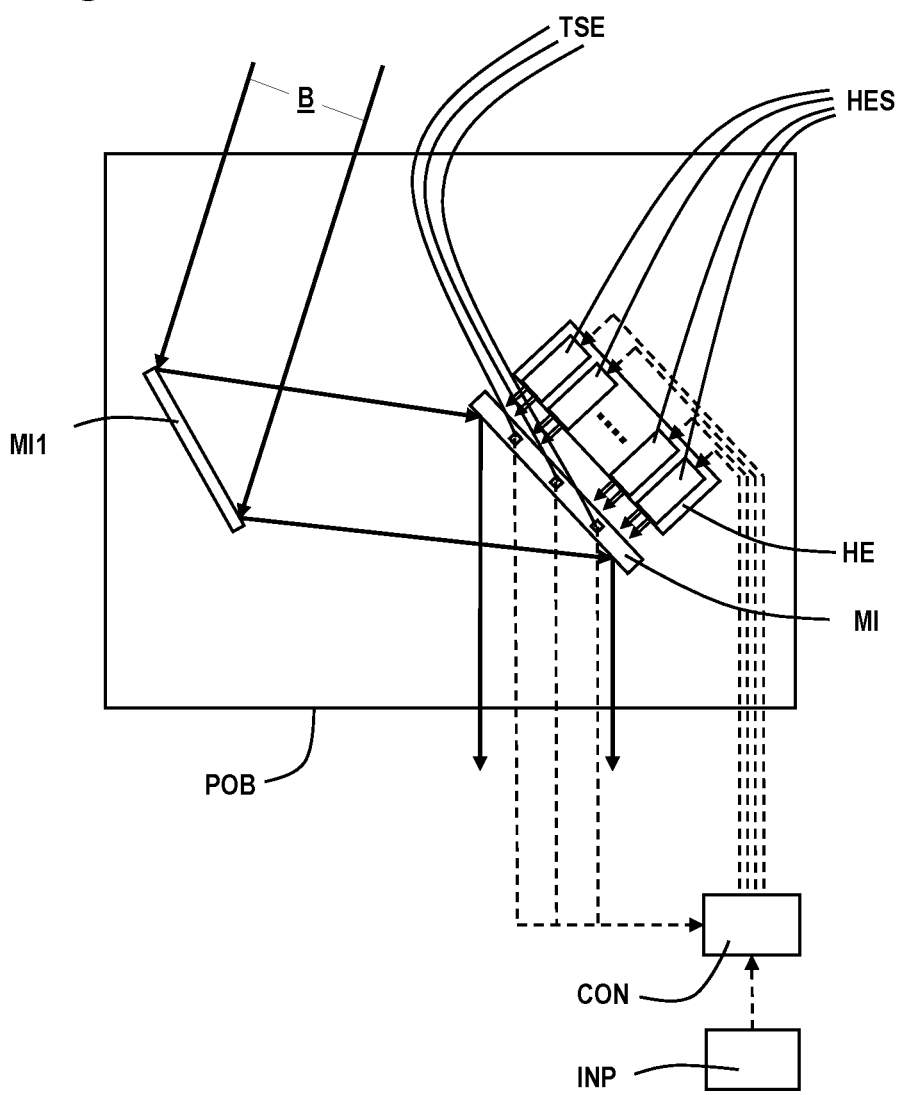
FIG. 2 depicts an embodiment of a projection optics box according to an embodiment of the invention; and detailed view of a part of the lithographic apparatus of FIG. 1.

FIG. 2 depicts schematically a projection optics box POB which is part of a projection system PS of a lithographic apparatus LA as depicted in FIG. 1. The projection optics box POB comprises a number of mirrors to guide the radiation beam B from the patterning device to the substrate W.

In other embodiment, the projection optics box POB may be part of a projection system PS of a lithographic apparatus LA as depicted in FIG. 4. For example the mirror MI may be any of the plurality of mirrors 13,14.

The mirror MI is shown as an example of such mirror in the projection optics box POB. The radiation beam B enters the projection optics box POB is reflected by a first mirror MI1, and impinges on the mirror MI, in particular a reflective surface thereof on which the radiation beam B is directed. The radiation beam is reflected by the mirror MI and leaves the projection optics box POB. In practice the projection optics box POB may comprise more than two mirrors to guide the radiation beam B.

The mirror MI is subject to heat induced by DUV, EUV and/or infrared light of the radiation beam B. This occurrence of heating due to the radiation beam B impinging on the mirror MI is referred to as mirror heating. This mirror heating may lead to undesired deformations of the reflective surface of the mirror MI that may have a significant impact on the overlay, focus and projection performance of the lithographic process.

The mirrors of the projection optics box POB, such as the mirror MI, may be made of ultra-low expansion glass having a low thermal sensitivity to reduce the effect of mirror heating. Despite the relatively low thermal sensitivity, the relatively high power of the radiation beam B that impinges on the mirror MI may still result in unacceptable deformation of the mirror MI. This is generally undesirable. The impact of mirror heating can partially be compensated via adjustments of the mirror and/or substrate support. This compensation mechanism is referred to as the driver lens model DLM. The correction capabilities of the driver lens model DLM itself are however insufficient to achieve the required mirror performance in more demanding lithographic processes. Uncorrectable errors, i.e. errors that cannot be compensated by the adjustments of the mirrors of the projection optics box POB and/or positioning of the substrate support by the DLM, remain.

To further reduce the effect of mirror heating, the temperature of the mirror MI may be influenced by a heater HE arranged to provide heat to the mirror MI without being in contact with the mirror MI. In the shown example, the heater HE is configured to provide heat on one side of the mirror MI. In other embodiments, the heater may be arranged to provide heat on the opposite reflecting side of the mirror MI, or on both sides of the mirror MI. This heat may provide additional heat which may be adjusted to the heat provided by the radiation beam B to create a controlled heat load to the mirror MI.

In alternative embodiment heaters, such as electrical wires, in contact with the heat sensitive element, here the mirror MI, may be used to provide controlled heat to the heat sensitive element.

A control device CON is provided to control the deformation of the mirror MI to maintain the deformation of the mirror MI at a predetermined level by heating with the heater HE. This heating may also be referred to as additional heating or preheating. The predetermined deformation is for example based on the temperature at which the thermal sensitivity of the mirror MI is the smallest. The thermal sensitivity of for example ultra-low expansion glass comprises a minimum value, where the derivative of the strain-temperature curve is zero, i.e. the zero-crossing temperature (ZCT). The temperature associated with this minimum value is a suitable temperature to use as basis for determining the predetermined deformation at which control of the control device CON is aimed.

It is also possible that other parameters, such as temperature parameters, mechanical parameters and/or optical parameters may be used as control objectives of the control strategy applied in the control device CON.

On or in the mirror MI, multiple temperature sensors TSE may be provided to measure a temperature signal representative for a temperature of the mirror MI at the location of the respective temperature sensor TSE. The temperature signals are fed into the control device CON. FIG. 2 shows three temperature sensors TSE. In practice, more or less temperature sensors TES may also be provided.

The control device CON is arranged to provide a actuation signal to a heater HE. The heater HE of the embodiment of FIG. 2 comprises multiple heater segments HES, wherein each heater segment HES is arranged to heat a selected part of the mirror MI. Each heater segment HES receives its individual actuation signal so that the heater segments HES can be individually controlled to heat the associated part of the mirror MI in order to obtain a predetermined temperature distribution and/or deformation in the mirror MI. The number of heater segments HES will be selected on the required distribution of individually controlled parts of the mirror MI.

In prior art embodiments only one heater is used to heat a respective mirror, whereby the heater is controlled by a single actuation signal based on the average temperature measured in the mirror MI. Since it takes a long time for the reflective surface of the mirror to reach a steady-state temperature profile after each patterning device change and corresponding change in characteristics of the radiation beam, such as power and spatial distribution of the power of the radiation beam B, an active feedback control strategy possibly combined with a transient feedforward signal has been used to adjust the power of the heater during transient responses in line with the change in the settings of the radiation beam.

With increasing demands on performance of a lithographic apparatus, the power of the radiation beam B may also be significantly increased. This also result in an additional challenge to control mirror heating.

The provision of multiple heater segments HES that are each associated with a respective part of the mirror MI, allows for a more defined control of the deformation of the mirror MI. However, the known control strategies for mirror preheating on the basis of the average temperature of the mirror MI are in general conservative and do not necessarily improve the projection performance in transient situations between subsequent use of two patterning devices having different radiation characteristics, as the set-points of this control strategy are typically based on a worst-case steady-state analysis only.

Therefore, there is a need to provide a control strategy that allows for a more accurate control of the deformation of the mirror MI to reduce the negative effect of mirror heating on overlay, focus and projection performance.

The novel control strategy is based on a feedforward controller arranged to provide a feedforward signal as part of the actuation signal fed to the heater HE, for example the individual actuation signals fed to the heater segments HES, wherein the feedforward controller comprises a non-linear thermo-mechanical 3D model of the mirror MI describing a dynamical relationship between the heat load on the mirror MI and deformation of the mirror MI. The feedforward controller is arranged to calculate the feedforward signal on the basis of an optimization calculation of the non-linear model. The temperature signals of the multiple temperature sensors TSE may be used as input to the non-linear model in the feedforward controller to calculate the feedforward signal.

In the non-linear thermo-mechanical 3D model, the heat load may be described by a well predictable, possibly time-varying heating power and spatial distribution.

The optimization calculation comprises optimization calculation of a time-sequence of control variables to optimize the surface deformation throughout a prediction horizon, taking into account constraints on actuation limits of the heater HE. The actuation limits of the heater HE for example include that the heater can only provide heat, i.e. has no cooling capability, and that the heater has a maximum heating capability.

The model used in the model predictive control method may be a high-order thermo-mechanical 3D model, having for example 10.000 to 1.000.000 states, that describes the dynamical relationship between a heat load on the mirror MI and deformation of the mirror MI, for example deformation of the reflective surface of the mirror MI. The model is for example a finite elements model of the mirror MI describing the geometry of the mirror MI and its thermal, mechanical and optical dynamical properties.

To allow the optimization calculation to be calculated in sufficient short time for real-time control, a multi-level solver may be applied. The multi-level solver may for example exploit the speed of approximate solvers, e.g., Jacobi based solvers, parallelization on a graphical processing unit (GPU), hot starts, etc.

The optimization calculation may for example be performed on parallel processors, such as GPU's, for real-time control. The parallel processors may for instance be arranged to a run a full optimization every 1, 10, or 100 seconds. Parallel processing may also be performed by using accelerator application-specific integrated circuits (ASIC), like tensor processing units (TPU's), or by using field-programmable gate arrays (FPGA's).

The inputs that can be used in this embodiment of the control strategy are for example the power level and/or spatial distribution of the power of the radiation beam B. Further, conditioning parameters, such as heat transfer coefficient of medium, e.g., gas or cooling water, ambient temperature and/or other parameters that influence the optical path of the radiation beam may be added as inputs in the optimization calculation of the non-linear model.

Alternatively or additionally, the spatial non-uniformity of the zero-crossing temperature, modelled by a power spectral density function may be further used as an input of the control strategy. This realization may be used to make sure that the opto-thermo-mechanical mirror pre-heating control strategy is robust with respect to the ZCT non-uniformities, namely, by evaluating the cost function in the model predictive control scheme over multiple (unique) realizations instead of over only one nominal case (an uniform ZCT).

In an embodiment, the non-linear model might be updated based on system setting data and/or system calibration data, for example setting data of the illumination system.

The novel model predictive control strategy may be used to directly minimize the errors of the radiation beam that cannot be corrected by the DLM, such as wave-front errors, in terms of relevant projection characteristics that are closely related to overlay, focus and projection performance. It has been found that this control strategy, in particular in combination with the individually controllable heating segments HES, provides a significant improvement in control performance for the compensation of the effects of mirror heating on the overlay, focus and projection performance of the lithographic process.

In addition to the temperature sensors TSE, or as an alternative, one or more sensors may be provided to measure aberration signals representative for wavefront aberrations of the radiation beam, wherein the control device CON is arranged to receive the aberration signals and to use the aberration signals to calculate the feedforward signal.

As a further addition or alternative, one or more strain sensors may be provided to measure one or more strain signals at one or more measurement locations of the heat sensitive element, wherein the control device CON is arranged to receive the strain signals and to use the strain signals to calculate the feedforward signal. Instead of using temperature measurements as inputs for calculating a local deformation of the mirror MI, it is also possible to use direct deformation measurements as input signals for calculating the feedforward signal.

In an embodiment, the feedforward controller may be combined with a feedback controller to further improve the control of the deformation of the mirror MI. The feedback control may for example be based on wave front measurements of the radiation beam B, temperature measurements within the mirror MI using temperature sensors TES, and/or on based on an explicit state observer that combines model predictions with measurements, such as wave front measurements, temperature measurements and/or strain measurements.

FIG. 3 shows an embodiment of a model predictive control (MPC) scheme that can be used to control the heating of the mirror MI, indicated in FIG. 3 in combination with heater HE and temperature sensors TES as mirror system MIS. The control scheme uses a thermo-mechanical non-linear model of the deformation within the mirror MI. The non-linear model is also comprised in a state estimator SES of the control device CON. Input of the state estimator SES are temperature signals Temp of the temperature sensors TES. The output of the state estimator SES is an estimated disturbance $Dist_{est}$ of the radiation beam B. This estimated disturbance $Dist_{est}$ of the radiation beam B is fed into the control unit CU that provides an actuation signal ACT to each of the heater segments HES to heat the mirror MI (indicated by MIS in FIG. 3).

At each time step an optimization calculation is carried out. The goal of this optimization calculation is to find an input sequence over a finite time horizon that minimizes a given cost function while obeying the relevant constraints, such as the maximum power of the heater segments HES and that the heater HE is not capable of cooling. The cost function may be directed to different performance indicators. For example, a root-mean-square cost function may be used to optimize for deformation, Zernike functions may be used to optimize for projection performance, and/or pattern shift, best focus, critical dimension uniformity may be used to optimize for imaging parameters.

Only the first entry of the resulting input sequence may be implemented on the actual system MIS since the optimization calculation is updated and solved at each time-step based on the temperature signals Temp of the most recent temperature sensor measurements by the temperature sensors TES.

In this embodiment of the control strategy, the cost function of the control scheme represents the relevant radiation characteristics taking into account the correction capabilities of DLM. To be more specific, the part of the radiation beam errors, i.e. projection/wave front errors, that can be corrected by DLM is estimated on the basis of the predicted mirror deformations and will not be included in the cost function, since this part of the radiation beam errors can effectively be corrected by the DLM. In the control scheme of FIG. 3 this is shown in that the mirror deformation DEF will be corrected by the DLM on the basis of a reference deformation $DEF_{ref}$ resulting in uncorrectable image distortions IMD.

Since the temperature-strain relation of the ultra-low expansion glass of the mirror MI is non-linear, the finite horizon optimization calculation is in general non-convex. To ensure that the closed-loop system converges to the desired steady-state and to avoid undesired oscillations in the closed-loop response, the control unit CU is fed with a reference ref. This reference ref comprises the desired input signal and non-correctable radiation beam errors at steady-state, which can be obtained via a separate optimization calculation that can be carried out before actual exposure of the radiation beam to a substrate.

Alternatively or additionally, the control unit CU may be further fed with the spatial non-uniformity of the zero-crossing temperature, modelled by a power spectral density function. This realization may be used to make sure that the opto-thermo-mechanical mirror pre-heating control strategy is robust with respect to the ZCT non-uniformities, namely, by evaluating the cost function in the model predictive control scheme over multiple (unique) realizations instead of over only one nominal case (an uniform ZCT).

One of the challenges in using non-linear model predictive control schemes is dealing with the computational complexity since at each time-step, an optimization calculation needs to be carried out within a reasonable amount of time. This issue is typically solved via model reduction techniques. A key assumption in model reduction is that the number of possible inputs is significantly smaller than the number of states of the original model. This assumption does not hold for mirror heating control as many different radiation beam settings/use-cases are possible, for example as a result of the may possible settings of the illumination system. Although only one use-case is active at the time, and thus other use-cases could be ignored per exposure, computing the reduced order model itself is in general a computational expensive process. For this reason, it is of interest to use a full order model, e.g. a full order finite elements model, in the control scheme. No model reduction techniques are used in the optimization calculation.

By applying a null-space method, the size of the optimization calculation that needs to be solved at each time-step in terms of number of variables, can be significantly reduced. As a result, the optimization calculation itself can be solved in the order of milliseconds. This method, however, does require a particular system response that needs to be computed on-line. This particular system response can efficiently obtained using a multi-level solver. Computing the particular response efficiently is not trivial due to the size of the full order model. Fortunately, the sparsity properties of the full order model can be exploited in order to efficiently obtain a solution using iterative methods, for example, the pre-conditioned conjugate gradient method.

The efficiency of this iterative method is governed by the choice of pre-conditioner. Adapted deflation is a suitable pre-conditioner since it allows to exploit the benefits of parallel/GPU computing. In adapted deflation, finding the solution of the full-order system is accelerated by correcting the full-order iterations by solutions from lower-dimensional problems, which can be computed relatively quickly. These lower-dimensional problems can for instance be obtained by projection on a proper orthogonal decomposition (POD) basis. For the proposed model predictive control strategy, the POD basis may be derived from the information contained in the pre-computed null-space matrix and previously obtained solutions, such as the solution of a previous time step when solving the time-domain solution of a dynamic system or the solution of previous frequency point when solving the frequency-domain solution of a dynamic system. Using this unique choice of POD basis and by warm starting the solver with the solution obtained at the previous time-step, only one iteration is needed to obtain the particular response. As a consequence, the computational effort may be close to the theoretical minimum amount of effort that is needed to obtain the solution of the full order finite elements model.

Alternatively or additionally, the pre-conditioned conjugate gradient method uses a multi-level or multi-grid method configured to correct iterations of the full dimensional linear system of equations with solutions from lower-dimensional approximations of the linear system of equations. The multi-level or multi-grid method may use the adapted deflation method above described.

In one embodiment, the preconditioner comprises projecting the residual at each iteration to a lower-dimensional space in order to obtain an estimate of the difference between the current iteration and the actual solution. This estimate can be used to correct the current iteration and thereby improve the convergence of the pre-conditioner method. In another embodiment, adapter the adapted deflation method may be regarded as a type of multi-level/multi-grid method.

As an alternative for the adapted deflation method other model order reduction techniques such as modal truncation, balancing and truncation or Krylov subspace-methods may be used.

The proposed opto-thermo-mechanical model predictive control strategy has been compared with a temperature-based control strategy for both an heater embodiment with a single heater and a heater embodiment with multiple individually controllable heater segments as shown in FIG. 2 in a number of simulations. For the single heater embodiment, the temperature based controller is a PID controller. For the embodiment with heat segments, multiple PID controllers were used per heater segment that aim to regulate the average temperature in each part associated with the respective heater segment to the zero-crossing temperature. The simulations were made for two load cases, i.e. two different settings of the radiation beam.

The simulations showed that the opto-thermo-mechanical control strategies using a non-linear opto-mechanical model significantly improve the overlay and focus performance with respect to those resulting from temperature-based control strategies, in particular in combination with an embodiment with multiple heater segments, since this further improves the controllability of deformation of the mirror MI.

Hereinabove, a control strategy is described to control the deformation of a mirror MI of the projection optics box POB of a lithographic apparatus. The method may also be used to control the deformation in other mirrors of the projection optics box POB, wherein the deformation of each mirror is separately controlled. Furthermore, in the control strategy, the effects of mirror heating of a first mirror of a projection optics box POB may be compensated by controlling the deformation in another mirror of the projection optics box (POB) to optimize the wave fronts of the radiation beam reflected by the mirrors.

Further, the model predictive control strategy can be used to compensate for intra-substrate effects that cannot be corrected with DLM, since DLM corrections are only computed and applied at moments at which new wave-front measurements are available. Intra-wafer effects can lead to focus errors, that may be caused a number of mirrors, in particular smaller mirror of a mirror assembly. By applying the individually controllable heater segments and the model predictive control strategy as described above the intra-wafer effects can be corrected. When these mirrors are relatively small, the time-scale of the thermal behavior of these mirrors will be relatively small. As a consequence, the control strategy applied on these relatively small mirrors can have a significantly larger bandwidth than a larger mirror and thereby are more suitable for correcting intra-wafer effects.

The control strategy described hereinabove for mirrors of a projection optics box may also be applied to control deformation of other heat sensitive elements of a lithographic apparatus or metrology tool for a lithographic production process that are subject to heat of a radiation beam impinging on the heat sensitive element.

Although specific reference may be made in this text to the use of a lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

Although specific reference may have been made above to the use of embodiments of the invention in the context of optical lithography, it will be appreciated that the invention, where the context allows, is not limited to optical lithography and may be used in other applications, for example imprint lithography.

Where the context allows, embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic storage media; optical storage media; flash memory devices; electrical, optical, acoustical or other forms of propagated signals (e.g. carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc. and in doing that may cause actuators or other devices to interact with the physical world.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the clauses set out below.

1. A method for thermo-mechanical control of a heat sensitive element subject to a heat load, comprising:
   providing a non-linear thermo-mechanical model of the heat sensitive element describing a dynamical relationship between the heat load on the heat sensitive element and deformation of the heat sensitive element;
   calculating a control signal on the basis of an optimization calculation of the non-linear model,
   providing an actuation signal to a heater, wherein the actuation signal is at least partially based on the control signal,
   heating the heat sensitive element by the heater on the basis of the actuation signal.

2. The method of clause 1, wherein the control signal is a feedforward signal.

3. The method of clause 1 or 2, wherein the optimization calculation comprises optimization calculation of a time-sequence of control variables to optimize the deformation of the heat sensitive element throughout a prediction horizon, taking into account constraints on actuation limits of the heater.

4. The method of any of the preceding clauses, wherein the non-linear model comprises a 3D model of the heat sensitive element describing a spatially non-uniform dynamical relationship between the heat load and the deformation of the heat sensitive element.

5. The method of any of the preceding clauses, wherein the heat load comprises heat of a radiation beam impinging on the heat sensitive element and heat provided by the heater.

6. The method of clause 5, wherein the method comprises:
   measuring aberration signals representative for wavefront aberrations of the radiation beam, and using the aberration signals to calculate the control signal.

7. The method of any of the preceding clauses, wherein the method comprises:
   measuring one or more temperature signals of one or more measurement locations of the heat sensitive element, and
   using the temperature signals to calculate the control signal.

8. The method of any of the preceding clauses, wherein the heater comprises multiple heater segments, that can be individually controlled and are arranged to heat different parts of the heat sensitive element,
   wherein the step of providing the actuation signal to the heater comprises providing an individual actuation signal to each of the heater segments.

9. The method of any of the preceding clauses, wherein the heater is a contactless heater arranged to heat the heat sensitive element without direct mechanical contact between the heater and the heat sensitive element.

10. The method of any of the clauses 1-9, wherein the heater comprises heating elements in mechanical contact with the heat sensitive element, such as electric wires mounted on or in the heat sensitive element.

11. The method of any of the preceding clauses, wherein the method comprises:
    measuring one or more strain signals at one or more measurement locations of the heat sensitive element, wherein the one or more strain signals are representative for deformation of the heat sensitive element at the one or more measurement locations, and
    using the strain signals to calculate the control signal.

12. The method of any of the preceding clauses, wherein the method comprises:
    measuring one or more temperature signals of one or more measurement locations of the heat sensitive element, and
    determining a feedback signal on the basis of the temperature signals, wherein the feedback signal is part of the actuation signal provided to the heater.

13. The method of any of the preceding clauses, wherein the heat sensitive element is a mirror or lens of a projection system of a lithographic apparatus.

14. The method of clause 13, wherein the optimization calculation is aimed at minimizing thermo-mechanical effects that result in wave front errors of the radiation beam.

15. The method of clause 13 or 14, wherein the optimization calculation includes optimization for scanner and imaging characteristics, such as overlay, focus and critical dimension of a lithographic process.

16. The method of any of the preceding clauses, wherein the method comprises the step of updating the non-linear model on the basis of system setting data and/or system calibration data.

17. The method of any of the preceding clauses, wherein the non-linear model is a full-order model.

18. The method of clause 17, wherein the optimization calculation comprises an iterative calculation method using solutions for lower-dimensional problems to correct full-order calculations.

19. The method of any of the preceding clauses, wherein the optimization calculation comprises using a cost function to find an input sequence over a finite time horizon that minimizes the cost function.

20. The method of clause 19, wherein the cost function comprises any of the following functions: root-mean-square cost function, Zernike functions, pattern shift, best focus, or critical dimension uniformity.

21. The method of any of the preceding clauses, wherein the method comprises performing the optimization calculation on parallel processors, such as GPU's, for real-time control.

22. A device for use in a lithographic production process, comprising:
    a light source arranged to provide a radiation beam
       a heat sensitive element arranged to be impinged by the radiation beam,
       a heater arranged to heat the heat sensitive element to control a temperature of the heat sensitive element,
       a control device to provide a actuation signal to the heater,
       wherein the control device comprises a controller arranged to provide a control signal as part of the actuation signal, wherein the controller comprises a non-linear thermo-mechanical model of the heat sensitive element describing a dynamical relationship between a heat load on the heat sensitive element and deformation of the heat sensitive element, and wherein the controller is arranged to calculate the control signal on the basis of an optimization calculation of the non-linear model.

23. The device of clause 22, wherein the control signal is a feedforward signal.

24. The device of clause 22 or 23, wherein the optimization calculation comprises optimization calculation of a time-sequence of control variables to optimize the deformation of the heat sensitive element throughout a prediction horizon, taking into account constraints on actuation limits of the heater.

25. The device of any of the clauses 22-24, wherein the non-linear model comprises a 3D model of the heat sensitive element describing a spatially non-uniform dynamical relationship between the heat load and the deformation of the heat sensitive element.

26. The device of any of the clauses 22-25, wherein the heat load comprises heat of the radiation beam impinging on the heat sensitive element and heat provided by the heater.

27. The device of clause 26, wherein the device comprises one or more sensors to measure aberration signals representative for wavefront aberrations of the radiation beam, and wherein the control device is arranged to receive the aberration signals and to use the aberration signals to calculate the control signal.

28. The device of any of the clauses 22-27, wherein the device comprises one or more temperature sensors to measure one or more temperature signals representative for a temperature of the heat sensitive element at one or more measurement locations of the heat sensitive elements, wherein the control device is arranged to receive the one or more temperature signals and to use the one or more temperature signals to calculate the control signal.

29. The device of any of the clauses 22-28, wherein the heater comprises multiple heater segments, that can be individually controlled and are arranged to heat different parts of the heat sensitive element, wherein the control device is arranged to provide individual actuation signals to each of the heater segments.

30. The device of any of the clauses 22-29, wherein the heater is a contactless heater arranged to heat the heat sensitive element without direct mechanical contact between the heater and the heat sensitive element.

31. The device of any of the clauses 22-30, wherein the heater comprises heating elements in mechanical contact with the heat sensitive element, such as electric wires mounted on or in the heat sensitive element.

32. The device of any of the clauses 22-31, wherein the device comprises one or more strain sensors to measure one or more strain signals at one or more measurement locations of the heat sensitive element, and wherein the control device is arranged to receive the strain signals and to use the strain signals to calculate the control signal.

33. The device of any of the clauses 22-32, wherein the device comprises one or more temperature sensors to measure one or more temperature signals representative for a temperature of the heat sensitive element at one or more measurement locations of the heat sensitive element, wherein the control device is arranged to receive the one or more temperature signal and to determine a feedback signal on the basis of the one or more temperature signals, wherein the feedback signal is part of the actuation signal provided to the heater.

34. The device of any of the clauses 22-33, wherein the device is a lithographic apparatus and wherein the heat sensitive element is a mirror or lens of a projection system of the lithographic apparatus.

35. The device of clause 34, wherein the optimization calculation is aimed at minimizing thermo-mechanical effects that result in wave front errors of the radiation beam.

36. The device of clause 34 or 35, wherein the optimization calculation includes optimization for scanner and imaging characteristics, such as overlay, focus and critical dimension of a lithographic process.

37. The device of any of the clauses 22-36, wherein the control device is configured to update the non-linear model on the basis of system setting data and/or system calibration data.

38. The device of any of the clauses 22-37, wherein the non-linear model is a full-order model.

39. The device of clause 38, wherein the optimization calculation comprises using solution for lower-dimensional problems to correct full-order iterations.

40. The device of any of the clauses 22-39, wherein the optimization calculation comprises using a cost function to find an input sequence over a finite time horizon that minimizes the cost function.

41. The device of clause 40, wherein the cost function comprises any of the following functions: root-mean-square cost function, Zernike functions, pattern shift, best focus, or critical dimension uniformity.

42. The device of any of the clauses 22-41, wherein the control device comprises multiple parallel processors to perform the optimization calculation for real-time control.

The invention claimed is:

1. A method for thermo-mechanical control of a heat sensitive element subject to a heat load, comprising:
providing a non-linear thermo-mechanical model of the heat sensitive element describing a dynamical relationship between the heat load on the heat sensitive element and deformation of the heat sensitive element,
at a first time step, calculating, for each of a plurality of future time steps including a next time step, a feedforward control signal on the basis of an optimization calculation of the non-linear model, the optimization calculation configured to optimize the deformation of the heat sensitive element throughout a prediction horizon corresponding to the plurality of future time steps, taking into account constraints on actuation limits of the heater,
at the next time step, providing an actuation signal to a heater, wherein the actuation signal is at least partially based on the control signal calculated at the first time step, and
heating the heat sensitive element by the heater on the basis of the actuation signal.

2. The method of claim 1, wherein the non-linear model comprises a 3D model of the heat sensitive element describing a spatially non-uniform dynamical relationship between the heat load and the deformation of the heat sensitive element.

3. The method of claim 1, wherein the heat load comprises heat of a radiation beam impinging on the heat sensitive element and heat provided by the heater,
wherein the method comprises:
measuring aberration signals representative for wavefront aberrations of the radiation beam, and
using the aberration signals to calculate the control signal.

4. The method of claim 1, wherein the heater comprises multiple heater segments, which are configured to be individually controlled and are arranged to heat different parts of the heat sensitive element,
wherein the step of providing the actuation signal to the heater comprises providing an individual actuation signal to each of the heater segments.

5. The method of claim 1, wherein the method comprises:
measuring one or more strain signals at one or more measurement locations of the heat sensitive element, wherein the one or more strain signals are representative for deformation of the heat sensitive element at the one or more measurement locations, and
using the strain signals to calculate the control signal.

6. The method of claim 1, wherein the method comprises:
determining a feedback signal on the basis of the temperature signals, wherein the feedback signal is part of the actuation signal provided to the heater.

7. The method of claim 1, wherein the heat sensitive element is a mirror or lens of a projection system of a lithographic apparatus,
wherein the optimization calculation is configured to minimize thermo-mechanical effects that result in wave front errors of the radiation beam.

8. The method of claim 1, wherein the method comprises the step of updating the non-linear model on the basis of system setting data and/or system calibration data.

9. The method of claim 1, wherein the non-linear model is a full-order model,
wherein the optimization calculation comprises an iterative calculation method using solutions for lower-dimensional problems to correct full-order calculations.

10. The method of claim 1, wherein the optimization calculation comprises using a cost function to find a control signal value sequence over a finite time horizon that minimizes the cost function.

11. The method of claim 10, wherein the cost function comprises any of the following functions: root-mean-square cost function, Zernike functions, pattern shift, best focus, or critical dimension uniformity.

12. The method of claim 1, further comprising:
measuring one or more temperature signals of one or more measurement locations of the heat sensitive element, and
using the temperature signals to calculate the control signal.

13. A device for use in a lithographic production process, the device comprising:
a light source arranged to provide a radiation beam,
a heat sensitive element arranged to be impinged by the radiation beam,
a heater arranged to heat the heat sensitive element to control a temperature of the heat sensitive element, and
a control device configured to provide a feedforward control signal as part of the actuation signal, wherein the control device comprises a non-linear thermo-mechanical model of the heat sensitive element describing a dynamical relationship between a heat load on the heat sensitive element and a deformation of the heat sensitive element, and wherein the control device is configured to:
at a first time step, calculate, for each of a plurality of future time steps including a next time step, the control signal on the basis of an optimization calculation of the non-linear model, the optimization calculation configured to optimize the deformation of the heat sensitive element throughout a prediction horizon corresponding to the plurality of future timesteps, taking into account constraints on actuation limits of the heater,
at the next time step, provide an actuation signal to the heater, the actuation signal being at least partially based on the control signal calculated at the first time step, and
heat the heat sensitive element by the heater on the basis of the actuation signal.

14. The method of claim 1, wherein the heat sensitive element is a mirror or lens of a projection system of a lithographic apparatus,
wherein the optimization calculation includes optimization for scanner and imaging characteristics.

15. The method of claim 14, wherein the scanner and imaging characteristics include overlay, focus, and critical dimension of a lithographic process.

16. The device of claim 13, wherein the heat load comprises heat of a radiation beam impinging on the heat sensitive element and heat provided by the heater.

17. A device for use in a lithographic production process, the device comprising:
a heater arranged to heat a heat sensitive element in a path of a radiation beam, the heater configured to control a temperature of the heat sensitive element, and
a control device comprising a non-linear thermo-mechanical model of the heat sensitive element describing a dynamical relationship between a heat load on the heat sensitive element and a deformation of the heat sensitive element, wherein the control device is configured to:
at a first time step, calculate, for each of a plurality of time steps including a next time step, a feedforward control signal on the basis of an optimization calculation of the non-linear model, the optimization calculation configured to optimize the deformation of the heat sensitive element throughout a prediction horizon corresponding to the plurality of future time steps, taking into account constraints on actuation limits of the heater,
at the next time step, provide an actuation signal to the heater, the actuation signal being at least partially based on the control signal calculated at the first time step, and
heat the heat sensitive element by the heater on the basis of the actuation signal.

18. The device of claim 17, wherein the heat load comprises heat of a radiation beam impinging on the heat sensitive element and heat provided by the heater.

19. A method for thermo-mechanical control of a heat sensitive optical element subject to heating by a radiation beam, the method comprising:
optimizing, over a time series as a whole, a modelled deformation of the heat sensitive optical element, taking into account heating by the radiation beam, heating by a heater, and constraints on actuation of the heater, using a non-linear model of a dynamical relationship between a heat load on the heat sensitive optical element and a deformation of the heat sensitive optical element;
calculating, based at least in part on the modelled deformation, a heater actuation signal for at least a first time increment of the time series; and
actuating the heater using the heater actuation signal.

20. The method of claim 19, further comprising:
  optimizing, over a new time series as a whole using the non-linear model of the dynamical relationship between the heat load on the heat sensitive optical element and the deformation of the heat sensitive optical element, a new modelled deformation of the heat sensitive optical element taking into account heating by the radiation beam, heating by the heater, and constraints on actuation of the heater;
  calculating, based at least in part on the new modelled deformation, a new heater actuation signal for at least a first time increment of the new time series; and
  actuating the heater using the new heater actuation signal.

21. The method of claim 20, wherein actuating the heater using the heater actuation signal comprises actuating the heater during the first time increment, and actuating the heater using the new heater actuating signal comprises actuating the heater during a time increment next to the first time increment.

22. A device for use in a lithographic production process, the device comprising:
  a light source arranged to provide a radiation beam,
  a heat sensitive optical element arranged to be impinged upon by the radiation beam,
  a heater arranged to heat the heat sensitive optical element, and
  a control device configured to:
    optimize, over a time series as a whole, a modelled deformation of the heat sensitive optical element taking into account heating by the radiation beam, heating by the heater, and constraints on actuation of the heater, using a non-linear model of a dynamical relationship between a heat load on the heat sensitive optical element and a deformation of the heat sensitive optical element,
    calculate, based at least in part on the modelled deformation, a heater actuation signal for at least a first time increment of the time series, and
    actuate the heater using the heater actuation signal.

23. The device of claim 22, wherein the control device is further configured to:
  optimize, over a new time series as a whole using the non-linear model of the dynamical relationship between the heat load on the heat sensitive optical element and the deformation of the heat sensitive optical element, a new modelled deformation of the heat sensitive optical element taking into account heating by the radiation beam, heating by the heater, and constraints on actuation of the heater;
  calculate, based at least in part on the new modelled deformation, a new heater actuation signal for at least a first time increment of the new time series; and
  actuate the heater using the new heater actuation signal.

24. The device of claim 23, wherein the control device is further configured to actuate the heater using the heater actuation signal during the first time increment, and to actuate the heater using the new heater actuating during a time increment next to the first time increment.

25. A method for thermo-mechanical control of a heat sensitive element subject to a heat load, the method comprising:
  providing a non-linear thermo-mechanical model of the heat sensitive element describing a dynamical relationship between the heat load on the heat sensitive element and deformation of the heat sensitive element; and
  for a plurality of time steps:
  measuring one or more strain signals at one or more measurement locations of the heat sensitive element, wherein the one or more strain signals are representative of deformation of the heat sensitive element at the one or more measurement locations,
  calculating a control signal using the strain signals and on the basis of an optimization calculation of the non-linear model,
  providing an actuation signal to a heater, wherein the actuation signal is at least partially based on the control signal,
  heating the heat sensitive element by the heater on the basis of the actuation signal.

* * * * *